(12) United States Patent
Hsu

(10) Patent No.: US 7,830,190 B2
(45) Date of Patent: Nov. 9, 2010

(54) DATA LATCH CIRCUIT WITH A PHASE SELECTOR

(75) Inventor: Cheng-Chung Hsu, Chang-Hua Hsien (TW)

(73) Assignee: Realtek Semiconductor Corp., Hsinchu (TW)

(*) Notice: Subject to any disclaimer, the term of this patent is extended or adjusted under 35 U.S.C. 154(b) by 148 days.

(21) Appl. No.: 11/861,317

(22) Filed: Sep. 26, 2007

(65) Prior Publication Data
US 2008/0074162 A1 Mar. 27, 2008

(30) Foreign Application Priority Data
Sep. 27, 2006 (TW) .............................. 95135782 A (51) Int. Cl.
*H03K 3/356* (2006.01)
(52) U.S. Cl. ........................................ 327/208; 327/12
(58) Field of Classification Search ......... 327/208–218, 327/2–12
See application file for complete search history.

(56) References Cited

U.S. PATENT DOCUMENTS

| | | | |
|---|---|---|---|
| 6,486,721 B2 * | 11/2002 | Greenstreet et al. ......... 327/211 |
| 6,653,875 B2 | 11/2003 | Partsch et al. | |
| 6,710,605 B2 | 3/2004 | Tang et al. | |
| 7,323,946 B2 * | 1/2008 | Seefeldt et al. ............... 331/25 |
| 7,423,919 B2 * | 9/2008 | Lin ............................. 365/194 |
| 7,471,131 B2 * | 12/2008 | Liu et al. .................... 327/158 |
| 2004/0124899 A1 * | 7/2004 | Cavazos et al. ............. 327/199 |

OTHER PUBLICATIONS

Cheng-Chung Hsu, "Phase Selector for Data Transmitting Device", U.S. Appl. No. 11/737,758, filed Apr. 20, 2007.

* cited by examiner

*Primary Examiner*—Lincoln Donovan
*Assistant Examiner*—Diana J Cheng
(74) *Attorney, Agent, or Firm*—Thomas, Kayden, Horstemeyer & Risley, LLP (57) ABSTRACT

The present invention provides a data latch circuit. The data latch circuit includes a first data latch unit, a second data latch unit, a third data latch unit, and a phase selector. The first data latch unit is used for latching a first input data according to a first clock signal and outputting a first output data. The second data latch unit is used for latching the first output data according to a second clock signal and outputting a second output data. The third data latch unit is used for latching the second output data according to a third clock signal and outputting an output data. The phase selector is coupled to the second data latch unit for generating the second clock signal to the second data latch unit according to phase relation between the first clock signal and the third clock signal.

18 Claims, 8 Drawing Sheets

DATA LATCH CIRCUIT WITH A PHASE SELECTOR

BACKGROUND OF THE INVENTION

1. Field of the Invention

The present invention relates to a data reception device and related method, and more particularly, to a data latch circuit with a phase selector, and a related method.

2. Description of the Prior Art

It is a large challenge for systems to keep each clock of a chip synchronous in some interface systems or larger chips. The chips on hand usually include digital circuits and analog circuits wherein the digital circuits occupy almost 80% of the chip area. Therefore, clock driving strength outputted from the digital circuits and capacitor effect caused from circuit layouts are estimated by circuit designers when a timing problem appears in the whole integrated circuit. Finally, clock phase errors are solved through the digital circuits by analyzing and estimating the delays between the clock signal utilized in the analog circuits and the clock signal outputted from the original clock source. Another timing problem is when a system has two clock generators with asynchronous clock signals, as timing violations can occur in the flip-flops or the data latch elements.

Figure 1:
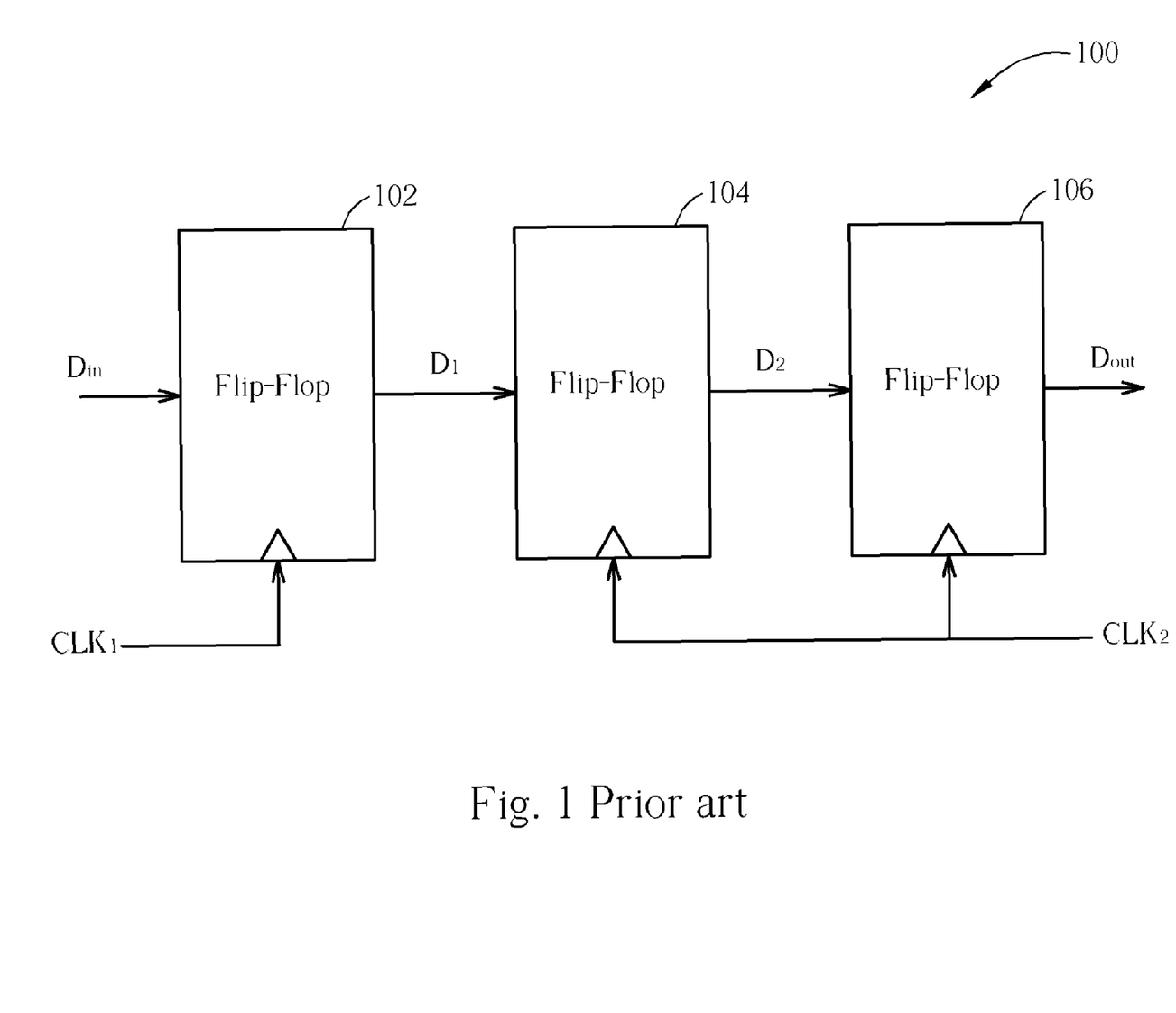
FIG. 1 is a diagram of a data latch circuit according to the prior art.
Figure 2:
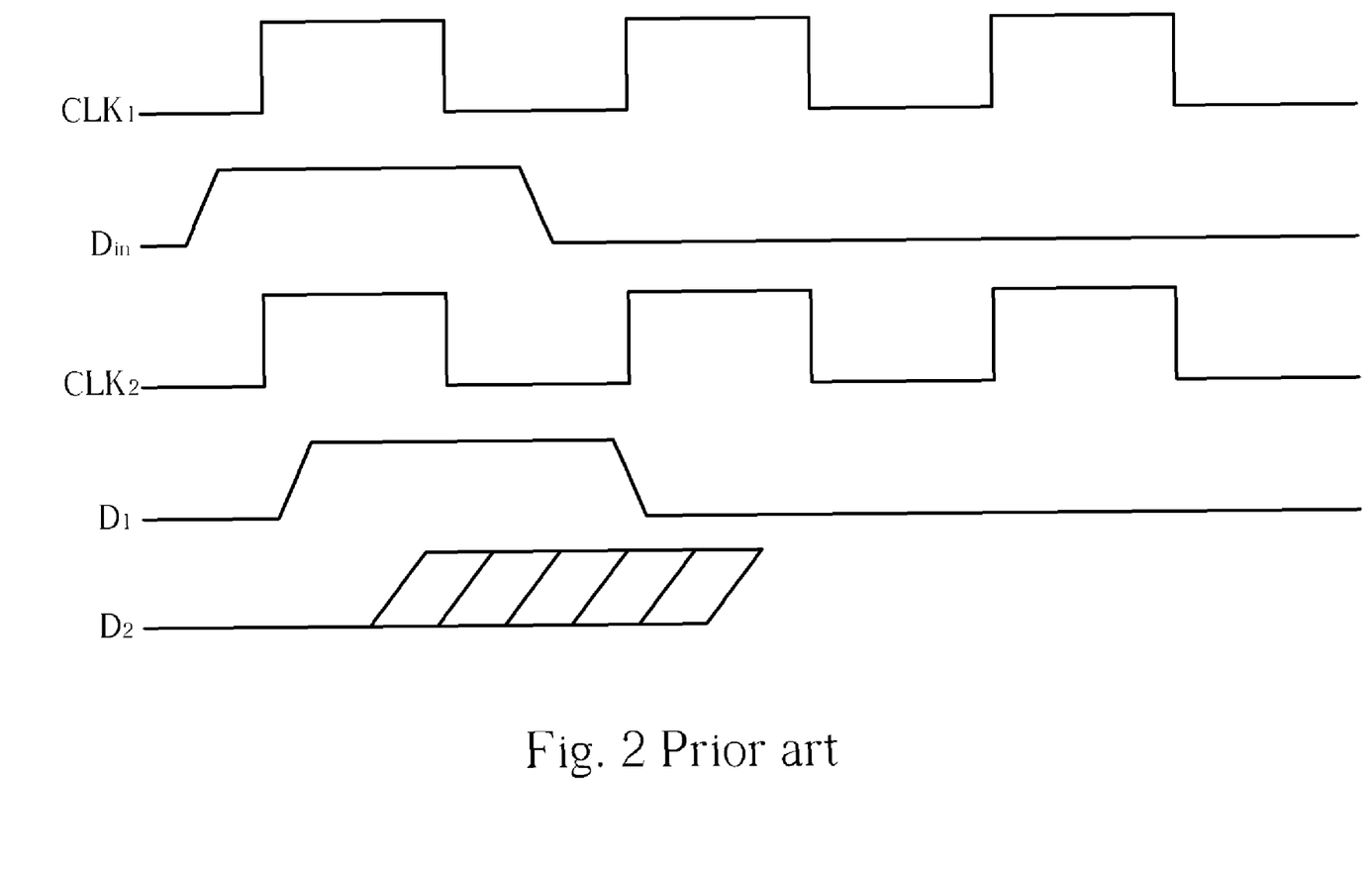
FIG. 2 is a timing diagram illustrating operations of the data latch circuit in FIG. 1.

Two successive D type flip-flops are used as data latch elements in general circuit designs in the prior art to prevent inconsistent clock signals. Repeat sampling is processed on the inputted data to ensure accuracy of data sampling. As shown in FIG. 1, a data latch circuit 100 in the prior art includes three flip-flops 102, 104, and 106 connected in series. The flip-flop 102 used for receiving an input data $D_{in}$ is triggered by a first clock signal $CLK_1$. The following two flip-flops 104 and 106 are triggered by a second clock signal $CLK_2$. A data output end of the last flip-flop 106 is used for latching an output data $D_{out}$. However, the data latch circuit 100 will have data error due to insufficient setup times and hold times. As shown in FIG. 2, a data $D_2$ obtained by the flip-flop 104 is not guaranteed due to a data $D_1$ being transformed when the flip-flop 104 samples the data D1 to get the data $D_2$ during the period when the flip-flop 102 is sampling the input data $D_{in}$. Hence, the accuracy of the output data $D_{out}$ generated later is influenced. In other words, although the accuracy of sampling data is improved by utilizing two successive data latch elements (the flip-flops 104 and 106) in the data latch circuit 100, sampling errors result from improper phase relation between the first clock signal $CLK_1$ and the second clock signal $CLK_2$.

SUMMARY OF THE INVENTION

It is therefore a primary objective of the present invention to provide a data latch circuit with a phase selector to solve the above-mentioned problem.

The claimed invention provides a data latch circuit with a phase selector. The data latch circuit includes a first data latch unit, a second data latch unit, a third data latch unit, and a phase selector. The first data latch unit is used for latching a first input data according to a first clock signal and outputting a first output data. The second data latch unit is used for latching the first output data according to a second clock signal and outputting a second output data. The third data latch unit is used for latching the second output data according to a third clock signal and outputting an output data. The phase selector is coupled to the second data latch unit for generating the second clock signal to the second data latch unit according to phase relation between the first clock signal and the third clock signal.

These and other objectives of the present invention will no doubt become obvious to those of ordinary skill in the art after reading the following detailed description of the preferred embodiment that is illustrated in the various figures and drawings.

DETAILED DESCRIPTION

This application is related to the application entitled "Phase selector for a data transmitting device" filed on Apr. 20, 2007, Ser. No. 11/737,758, and the entire disclosure of which is incorporated herein by reference.

Figure 3:
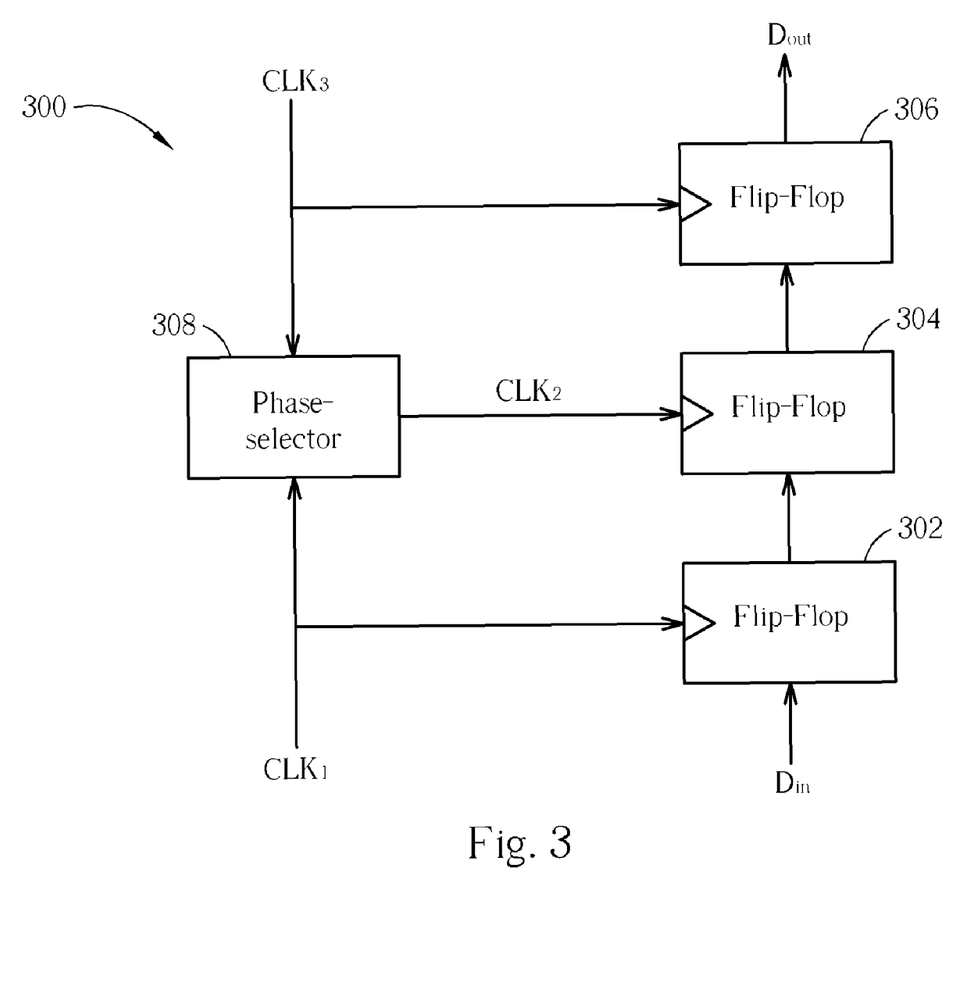
FIG. 3 is a diagram of a data latch circuit according to an embodiment of the present invention.

Please refer to FIG. 3. FIG. 3 is a diagram of a data latch circuit 300 according to an embodiment of the present invention. In this embodiment, the data latch circuit 300 includes three flip-flops (such as a D flip-flop) 302, 304, and 306 connected in series, and a phase selector 308. The flip-flop 302 used for receiving an input data $D_{in}$ is triggered by a first clock signal $CLK_1$. The flip-flop 306 used for generating an output data is triggered by a third clock signal $CLK_3$. The flip-flop 304 located in the middle is triggered by a second clock signal $CLK_2$ which is generated by the phase selector 308 according to phase relation between the first clock signal $CLK_1$ and the third clock signal $CLK_3$. In this embodiment, the phase selector 308 is used for outputting the third clock signal $CLK_3$ or an inverse signal of the third clock signal $CLK_3$ selectively as the second clock signal $CLK_2$ according to phase relation between the first clock signal $CLK_1$ and the third clock signal $CLK_3$. It should be noted that the present invention is not limited to utilizing the inverse signal of the third clock signal $CLK_3$ only, and a delayed clock signal of the third clock signal $CLK_3$, having a predetermined phase difference with the clock signal $CLK_3$, can be adopted as another embodiment of the present invention.

Figure 4:
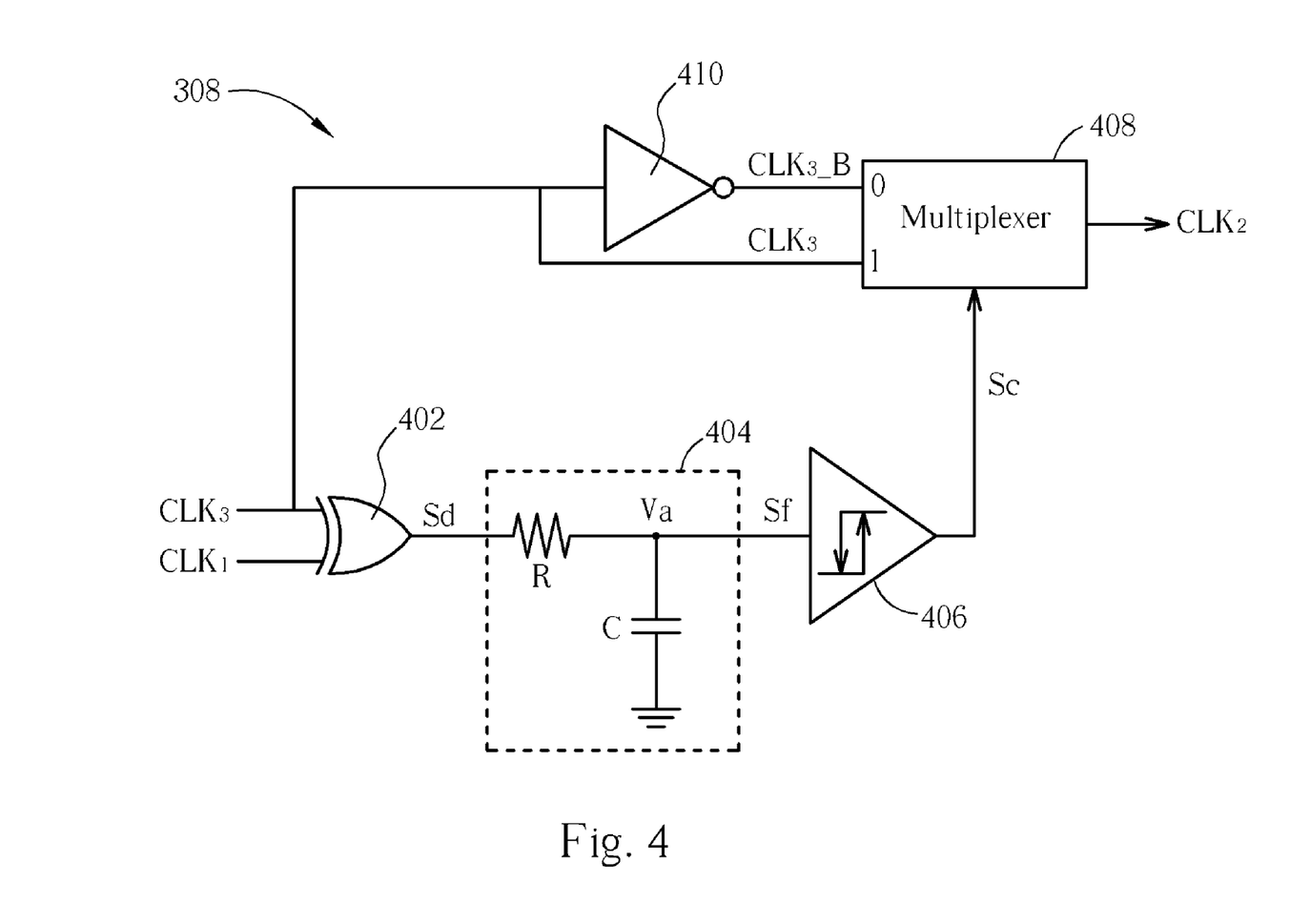
FIG. 4 is a diagram illustrating an embodiment of the phase selector in FIG. 3.

Please refer to FIG. 4. FIG. 4 is a diagram illustrating an embodiment of the phase selector 308 in FIG. 3. The phase selector 308 includes a phase detector 402, a decision unit composed of a filter 404 and a hysteresis buffer 406, a multiplexer 408, and an inverter 410. In this embodiment, the phase detector 402 is implemented by an XOR logic gate, the filter 404 is a low-pass filter composed of a resistor R and a capacitor C, and the hysteresis buffer 406 is implemented by a Schmitt trigger. Please note that the above XOR logic gate, the low-pass filter 404, the hysteresis buffer 406 and inverter 410 are merely examples for illustrating the phase detector 402. Furthermore, the inverter 410 can be replaced by a delay circuit to generate any clock phase that is needed. These elements are not necessarily restrictions on the present invention. As shown in FIG. 4, the phase detector 402 compares phase relation or phase difference between the first clock signal $CLK_1$ and the third clock signal $CLK_3$ to output a detection signal $S_d$. Then the filter 404 filters (low-pass filtering) the detection signal $S_d$ to smooth waveforms of the detection signal $S_d$ to generate a filtering signal $S_f$. One end of the capacitor C will build a corresponding voltage $V_a$ of the filtering signal $S_f$. Assume that the hysteresis characteristic of the hysteresis buffer 406 is defined by two thresholds $V_{TH\_01}$ and $V_{TH\_10}$ ($V_{TH\_01} > V_{TH\_10}$). That is, the hysteresis buffer 406 transforms the control signal $S_c$ from logic level "0" into logic level "1" when the control signal $S_c$ is logic level "0" at present and the voltage $V_a$ rises to or greater than the threshold $V_{TH\_01}$. At this time, the third clock signal $CLK_3$, will be outputted via the multiplexer 408 as the second clock signal $CLK_2$. On the other hand, the hysteresis buffer 406 transforms the control signal $S_c$ from logic level "1" into logic level "0" when the control signal $S_c$ is logic level "1" at present and the voltage $V_a$ decreases to or lower than the threshold $V_{TH\_10}$. The same, at this time, the inverse signal of the third clock signal $CLK_{3\_B}$ will be outputted via the multiplexer 408 as the second clock signal $CLK_2$. In this embodiment, the hysteresis buffer 406 is utilized to avoid switching unceasingly between the third clock signal $CLK_3$ and its inverse signal $CLK_{3\_B}$ due to slight undulation of the voltage $V_a$ which results in instability in the output of the phase selector 308 and sampling errors. Please note that the hysteresis buffer 406 is an optional element if the phase selector 308 will not result in system error due to slight undulation.

Figure 5:
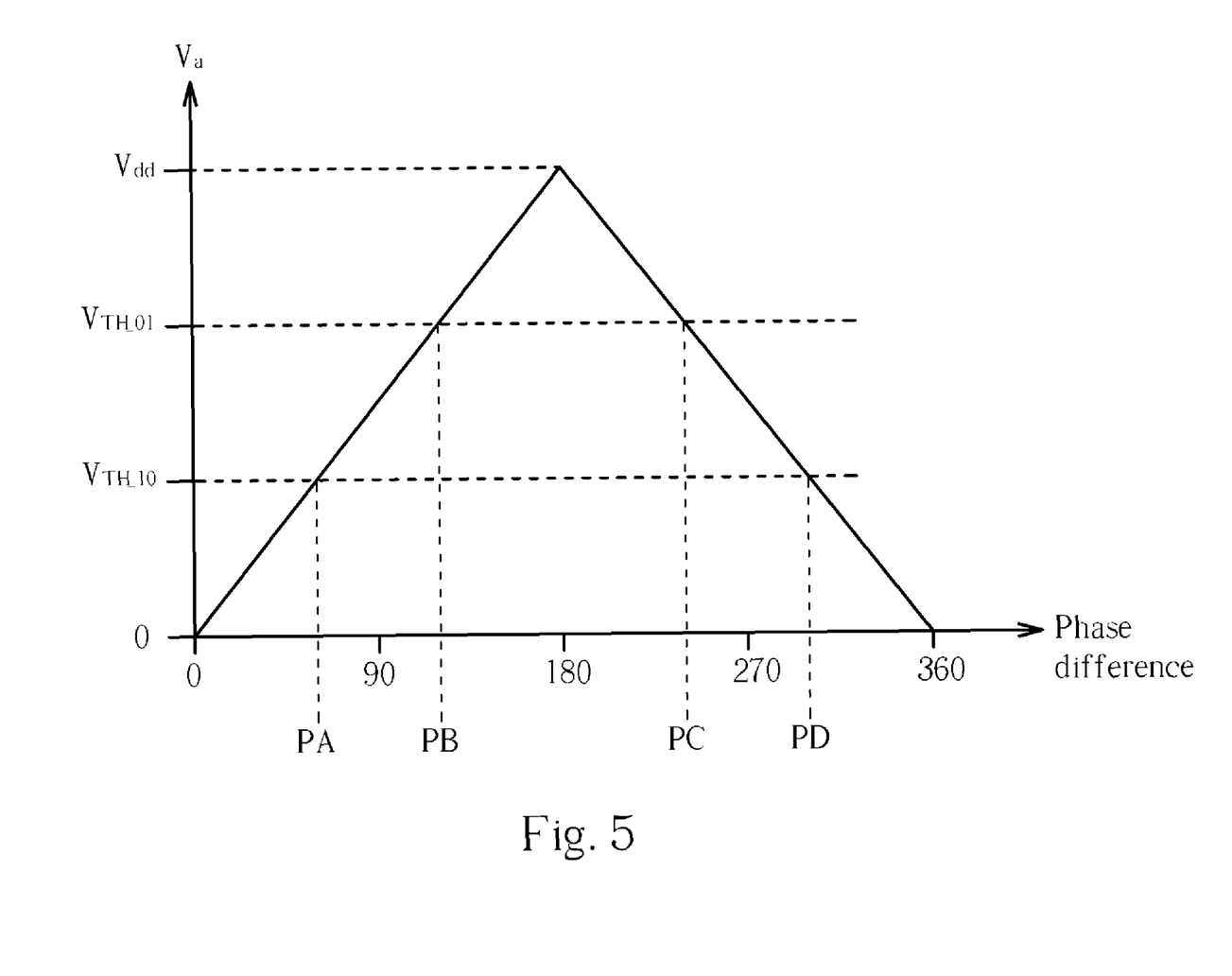
FIG. 5 is a diagram illustrating a first relationship between phase differences of the first clock signal and the third clock signal and the voltage.
Figure 6:
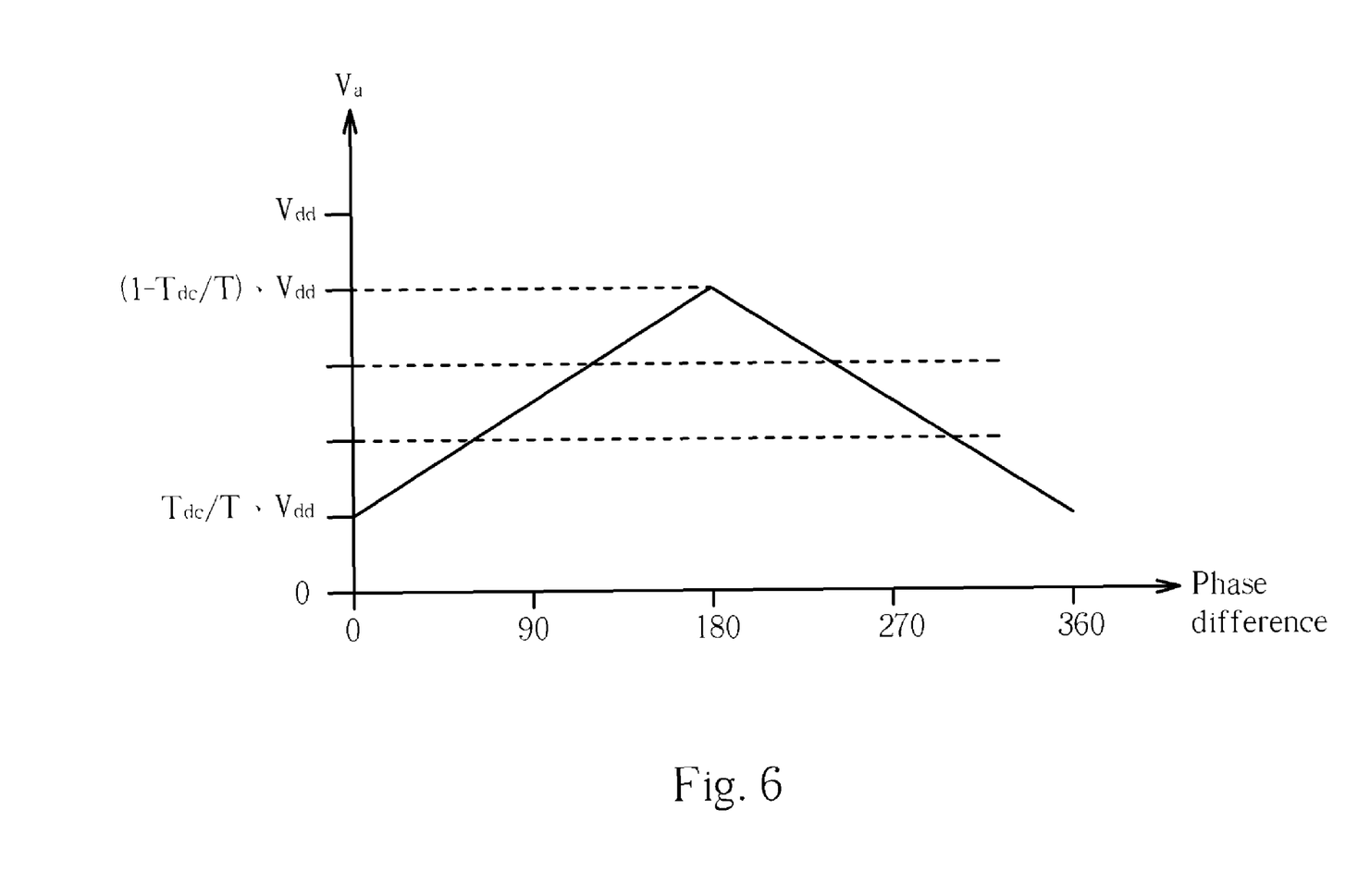
FIG. 6 is a diagram illustrating a second relationship between phase differences of the first clock signal and the third clock signal and the voltage.

Please refer to FIG. 5 and FIG. 6. FIG. 5 is a diagram illustrating a first relationship between the voltage $V_a$ and phase difference of the first clock signal $CLK_1$ and the third clock signal $CLK_3$. FIG. 6 is a diagram illustrating a second relationship between the voltage $V_a$ and phase difference of the first clock signal $CLK_1$ and the third clock signal $CLK_3$ and. Assume that the first clock signal $CLK_1$ and the third clock signal $CLK_3$ have the same period and the same duty cycle. The voltage $V_a$ corresponds to a maximum value $V_{dd}$ ($V_{dd}$ is the voltage level of the detection signal $S_d$ corresponding to logic level "1") when the first clock signal $CLK_1$ and the third clock signal $CLK_3$ have opposite phases (with a 180 degree phase difference). The voltage $V_a$ corresponds to a minimum value 0 when the first clock signal $CLK_1$ and the third clock signal $CLK_3$ have the same phase (with a 0 degree phase difference). The phase difference PA and PD correspond to the threshold $V_{TH\_10}$, and the phase difference PB and PC correspond to the threshold $V_{TH\_01}$. Moreover, assuming that the first clock signal $CLK_1$ and the third clock signal $CLK_3$ have the same period but different duty cycles, then the relationship between the voltage $V_a$ and phase difference of the first clock signal $CLK_1$ and the third clock signal $CLK_3$ will like the characteristic shown in FIG. 6. Assume the period of the first clock signal $CLK_1$ and the third clock signal $CLK_3$ are both T. Throughout a period T, the time difference between the time length during which the first clock signal $CLK_1$ is at logic level "1" and the time length during which the third clock signal $CLK_3$ is at logic level "1" is $T_{dc}$. The voltage $V_a$ is merely increased to $V_{dd}-(T_{dc}/T)*V_{dd}$ but does not reach the maximum value $V_{dd}$ due to the time difference $T_{dc}$ causing a DC offset $(T_{dc}/T)*V_{dd}$ when the first clock signal $CLK_1$ and the third clock signal $CLK_3$ have opposite phases (with a 180 degree phase difference). The voltage $V_a$ is merely decreased to $(T_{dc}/T)*V_{dd}$ but does not reach the minimum value 0 due to the time difference $T_{dc}$ causing a DC offset $(T_{dc}/T)*V_{dd}$ when the first clock signal $CLK_1$ and the third clock signal $CLK_3$ have the same phase (with a 0 degree phase difference). In conclusion, the hysteresis buffer 406 can operate normally under different clock conditions by setting the thresholds $V_{TH\_01}$ and $V_{TH\_10}$ appropriately.

Finally, two input ends of the multiplexer 408 are used for receiving the third clock signal $CLK_3$ and the inverse signal $CLK_{3\_B}$ of the third clock signal $CLK_3$ outputted from the inverter 410 respectively. The multiplexer 408 outputs the inverse signal $CLK_{3\_B}$ or the third clock signal $CLK_3$ as the second clock signal $CLK_2$ to trigger the flip-flop 304 according to logic levels of the control signal $S_c$ outputted by decision unit.

Figure 7:
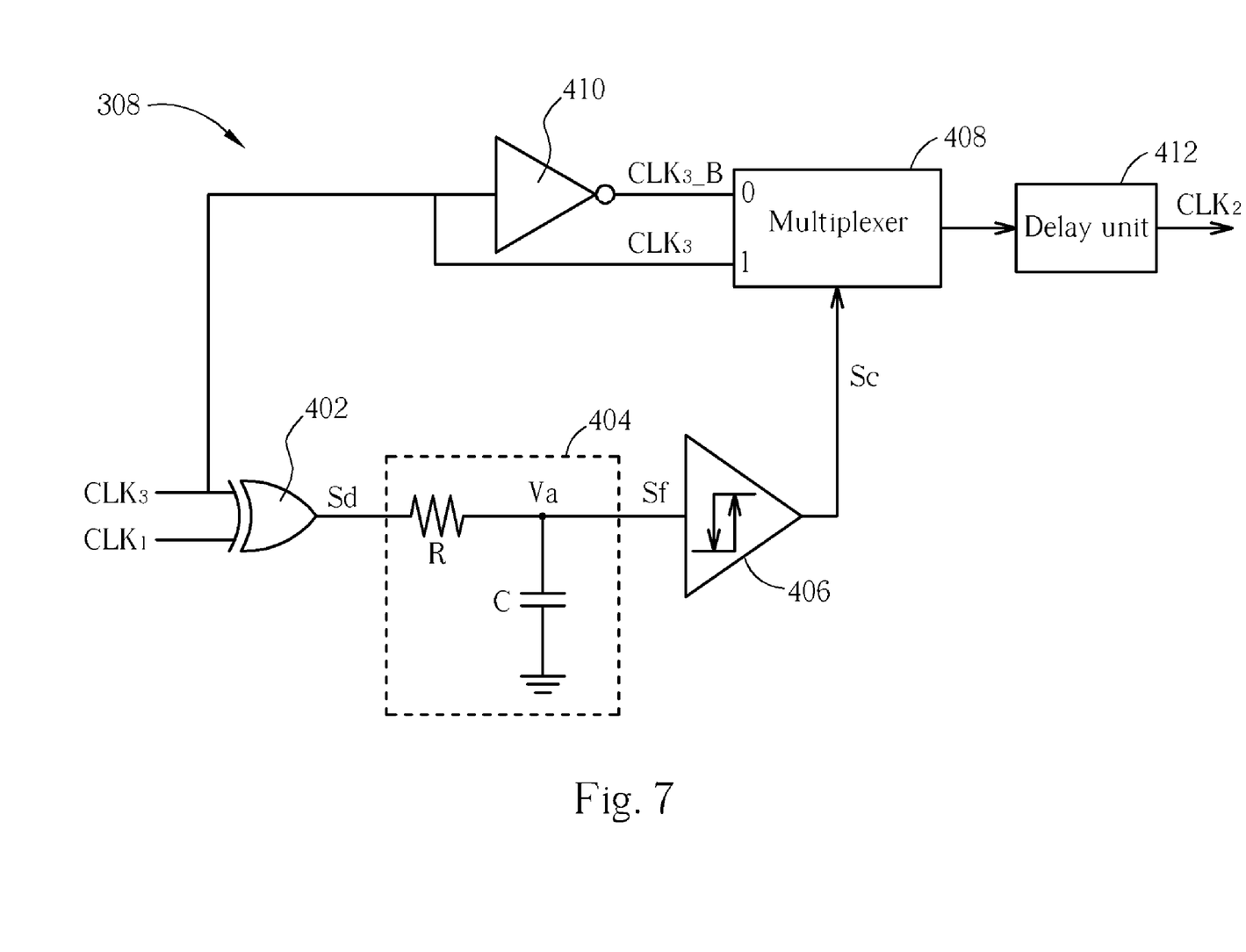
FIG. 7 is a diagram illustrating another embodiment of the phase selector in FIG. 3.

Please refer to FIG. 7. FIG. 7 is a diagram illustrating another embodiment of the phase selector 308 in FIG. 3. Besides elements shown in FIG. 4, the phase selector 308 in this embodiment further includes a delay unit 412 coupled to the output end of the multiplexer 408 for adding a delay $T_d$ to output signals (the third clock signal $CLK_3$ or the inverse signal $CLK_{3\_B}$) from the inverter 410 to output the desired second clock signal $CLK_2$ finally. The installation of the delay unit 412 is used for further fine-tuning of phase relation between clock signals used in the flip-flop 302 and the flip-flop 340. That is, making the first clock signal $CLK_1$ and the second clock signal $CLK_2$ tend to ideal inverse phase to improve data sampling problems resulting from setup time and hold time of flip-flops. In short, the delay $T_d$ provided by the delay unit 412 is capable of increasing margins to prevent data sampling errors. Furthermore, the delay time of the delay unit 412 can be designed to fixed or adjustable according to the application requirement. The setting of the delay $T_d$ provided by the delay unit 412 is explained in the following.

To explain the setting of the delay $T_d$ more conveniently, an example of the first clock signal $CLK_1$ and the third clock signal $CLK_3$ having the same period and the same duty cycle will be described in the following. Please refer to FIG. 5 and FIG. 7. The control signal $S_c$ will transform from the logic level "1" to the logic level "0" when the phase difference between the first clock signal $CLK_1$ and the third clock signal $CLK_3$ increases to greater than PB or decreases to lower than PC. The control signal $S_c$ will remain at logic level "1" when the current logic level of the control signal $S_c$ is "1" and the phase difference between the first clock signal $CLK_1$ and the third clock signal $CLK_3$ falls in a range between PA and PD. The first clock signal $CLK_1$ and the third clock signal $CLK_3$ tend to an inverse phase relation when the logic level of the control signal $S_c$ is "1". Therefore, the multiplexer 408 will choose to output the third clock signal $CLK_3$. Thus it can be seen that the maximum value of the delay $T_d$ corresponds to a phase difference (360−PD) when the multiplexer 408 chooses to output the third clock signal $CLK_3$. Hence, under statuses of the logic level of the control signal $S_c$ being "1", the restrictions on the delay $T_d$ is described in the following:

$$T_d \leq \frac{T \cdot V_{TH\_10}}{2V_{dd}} \quad \text{Equation (1)}$$

On the other hand, the control signal $S_c$ will transform from the logic level "1" to the logic level "0" when the phase difference between the first clock signal $CLK_1$ and the third clock signal $CLK_3$ decreases to lower than PA or increases to greater than PD. The first clock signal $CLK_1$ and the third clock signal $CLK_3$ tend to be in a phase relation when the logic level of the control signal $S_c$ is "0". Therefore, the multiplexer 408 will choose to output the inverse signal $CLK_3\_B$. Thus it can be seen that the maximum value of the delay $T_d$ corresponds to a phase difference (180–PB) when the multiplexer 408 chooses to output the inverse signal $CLK_3\_B$. Hence, under statuses of the logic level of the control signal $S_c$ is "0", the restrictions on the delay $T_d$ are described in the following:

$$T_d \leq \frac{T \cdot (V_{dd} - V_{TH\_01})}{2V_{dd}} \quad \text{Equation (2)}$$

In conclusion, the setting of the delay $T_d$ for the delay circuit 412 in the present invention must fit in with the following equations:

$$T_d \leq \min\left\{\frac{T \cdot V_{TH\_10}}{2V_{dd}}, \frac{T \cdot (V_{dd} - V_{TH\_01})}{2V_{dd}}\right\} \quad \text{Equation (3)}$$

In the equation (3), $\min\{\bullet\}$ represents processing a minimum operation.

Figure 8:
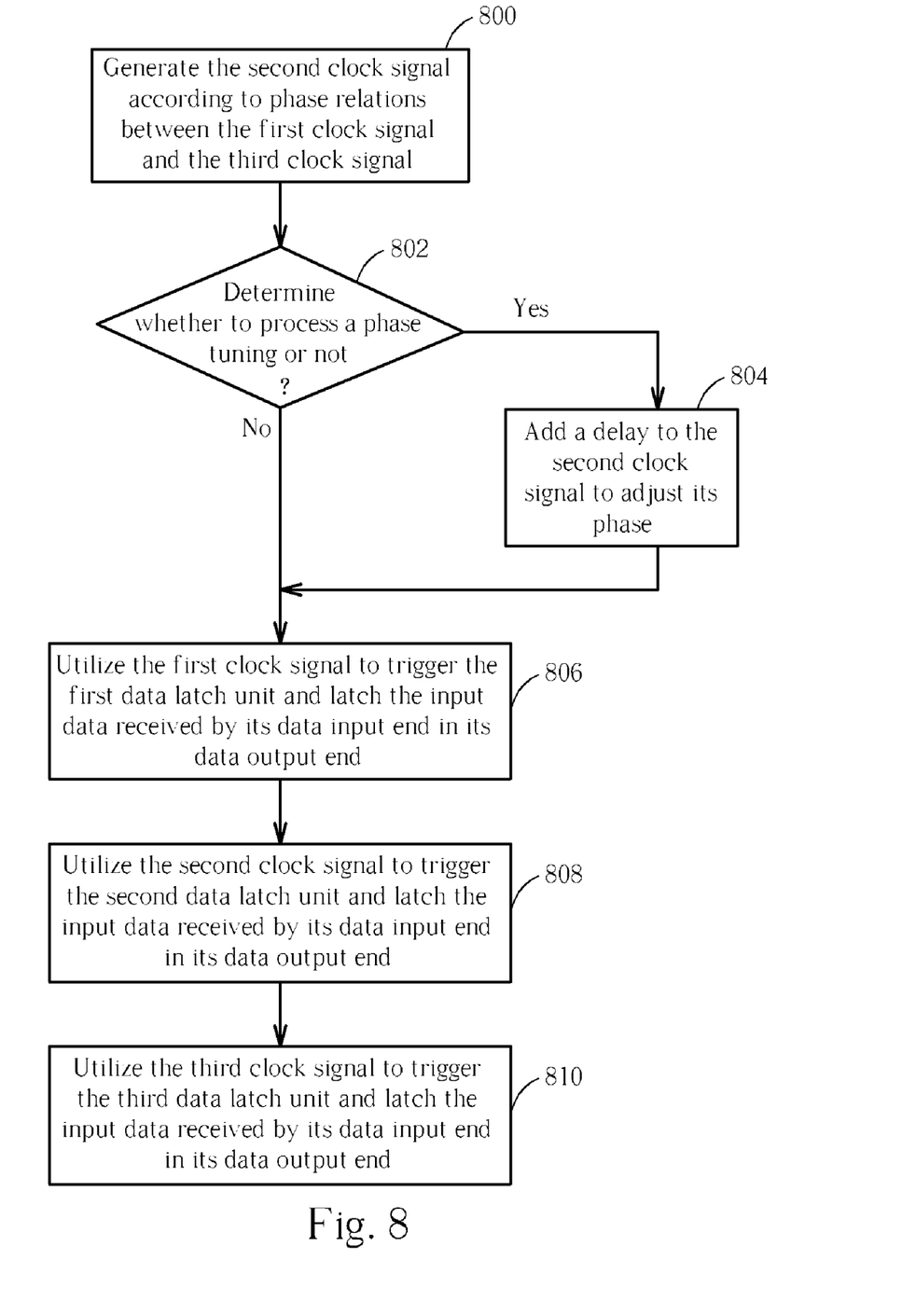
FIG. 8 is a diagram illustrating a flow chart of a data latch method according to an embodiment of the present invention.

Please refer to FIG. 8. FIG. 8 is a diagram illustrating a flow chart of a data latch method according to an embodiment of the present invention. The data latch method in the present invention is implemented by the above mentioned data latch circuit 300, and its operation is described as follows. Please notice that the steps defined in the flow chart in FIG. 8 are merely for explaining the method more clearly and are not necessary restrictions on the present invention. For example, some steps can be executed simultaneously or in interchangeable orders.

Step 800: Generate the second clock signal according to phase relation between the first clock signal and the third clock signal.

Step 802: Determine whether to process a phase tuning or not. If yes, proceed to step 804; otherwise, proceed to step 806.

Step 804: Add a delay to the second clock signal to adjust its phase and then proceed to step 806.

Step 806: Utilize the first clock signal to trigger the first data latch unit and latch the input data received by its data input end in its data output end.

Step 808: Utilize the second clock signal to trigger the second data latch unit and latch the input data received by its data input end in its data output end.

Step 810: Utilize the third clock signal to trigger the third data latch unit and latch the input data received by its data input end in its data output end.

In the above-mentioned steps, the first clock signal, the second clock signal, and the third clock signal correspond to the above-mentioned clock signals $CLK_1$, $CLK_2$, and $CLK_3$ respectively. The first data latch unit, the second data latch unit, and the third data latch unit correspond to the above flip-flops 302, 304, and 306. Please note that detailed operations of the corresponding data latch method executed by the data latch circuit 300 are not given as operations of the data latch circuit 300 are already fully explained above.

The practical applications of the data latch circuit in the present invention are applied in many categories. Take the data latch circuit 300 in the first embodiment as an example. The first clock signal $CLK_1$ and the third clock signal $CLK_3$ can be generated by the same clock generator or different clock generators. The flip-flop 302 is installed in an analog circuit, and the flip-flops 304 and 306 are installed in a digital circuit of the data latch circuit 300. On the other hand, the flip-flop 302 can be installed in a digital circuit, and the flip-flops 304 and 306 are installed in an analog circuit of the data latch circuit 300. Furthermore, the data latch circuit 300 can be installed in different chips. For example, the flip-flop 302 is installed in the output end of one chip, and the flip-flops 304, 306 and the phase selector 308 are installed in the input end of another chip. When the flip-flop outputs a data signal, the flip-flop 304 receives the data signal through a pin to complete data latch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data latch circuit comprising:
   a first data latch unit, for latching a first input data according to a first clock signal and outputting a first output data;
   a second data latch unit, coupled to the first data latch unit, for latching the first output data according to a second clock signal and outputting a second output data;
   a third data latch unit, coupled to the second data latch unit, for latching the second output data according to a third clock signal and outputting an output data; and
   a phase selector, coupled to the second data latch unit, for generating the second clock signal to the second data latch unit according to a phase relation between the first clock signal and the third clock signal, the phase selector comprising:
      a phase detector, receiving the first clock signal and the third clock signal, for detecting the phase relation between the first clock signal and the third clock signal to generate a detection signal;
      a phase adjustment unit, receiving the third clock signal, for generating a fourth clock signal according to the third clock signal, wherein there is a phase difference between the fourth clock signal and the third clock signal;
      a decision unit, coupled to the phase detector, for generating a decision signal according to the detection signal; and
      a select unit, coupled to the phase adjustment unit, for selectively outputting the third clock signal or the fourth clock signal as the second clock signal according to the decision signal.

2. The data latch circuit of claim 1, wherein the first data latch unit, the second data latch unit, and the third data latch unit are flip-flops.

3. The data latch circuit of claim 1, wherein a data output end of the first data latch unit is coupled to a data input end of the second data latch unit, and a data output end of the second data latch unit is coupled to a data input end of the third data latch unit.

4. The data latch circuit of claim 1, wherein the phase selector is used for selectively outputting the third clock signal or an inverse signal of the third clock signal as the second clock signal according to the phase relation between the first clock signal and the third clock signal.

5. The data latch circuit of claim 1, wherein the phase detector is an XOR logic gate for performing an XOR logic operation on the first clock signal and on the third clock signal to generate the detection signal.

6. The data latch circuit of claim 1, wherein the phase selector further comprises:
a delay unit, coupled to the select unit, for adding a predetermined delay time at the output of the select unit.

7. The data latch circuit of claim 1, wherein the phase adjustment unit is an inverter, the inverter is used for inverting the third clock signal to output the fourth clock signal, and the phase difference between the fourth clock signal and the third clock signal is substantially equal to 180 degrees.

8. The data latch circuit of claim 1 wherein the decision unit comprises:
a filter, coupled to the phase detector, for filtering the detection signal to generate a filtering signal; and
a hysteresis buffer, coupled between the filter and the select unit, for transforming the filtering signal into the decision signal according to a hysteresis characteristic and outputting the decision signal to the select unit to control the select unit to output the third clock signal or the fourth clock signal.

9. The data latch circuit of claim 8, wherein the hysteresis buffer is a Schmitt trigger.

10. The data latch circuit of claim 1, wherein the first clock signal and the third clock signal are generated from different clock generators.

11. A data latch circuit comprising:
a first data latch unit, for latching a first input data according to a first clock signal and outputting a first output data;
a second data latch unit, coupled to the first data latch unit, for latching the first output data according to a second clock signal and outputting a second output data; and
a phase selector, coupled to the second data latch unit, for generating the second clock signal to the second data latch unit according to a phase relation between the first clock signal and a third clock signal, the phase selector comprising:
a phase detector, receiving the first clock signal and the third clock signal, for detecting phase relation between the first clock signal and the third clock signal to generate a detection signal;
a phase adjustment unit, for generating the delayed signal of the third clock signal according to the third clock signal;
a decision unit, coupled to the phase detector, for generating- a decision signal according to the detection signal; and
a select unit, coupled to the phase adjustment unit, for selectively outputting the third clock signal or a delayed signal of the third clock signal as the second clock signal according to the detection signal;
wherein the second clock signal is the third clock signal or the delayed signal of the third clock signal.

12. The data latch circuit of claim 11, wherein the phase detector is an XOR logic gate for performing an XOR logic operation on the first clock signal and on the third clock signal to generate the detection signal.

13. The data latch circuit of claim 11, wherein the phase selector further comprises:
a delay unit, coupled to the select unit, for adding a predetermined delay time at the output of the select unit.

14. The data latch circuit of claim 11, wherein the phase adjustment unit is an inverter.

15. The data latch circuit of claim 11, wherein the phase difference between the delayed signal of the third clock signal and the third clock signal is substantially equal to 180 degrees.

16. The data latch circuit of claim 11 wherein the decision unit comprises:
a filter, coupled to the phase detector, for filtering the detection signal to generate a filtering signal; and
a hysteresis buffer, coupled to the filter and to the select unit, for transforming the filtering signal into the decision signal according to a hysteresis characteristic and outputting the control signal to the select unit to control the select unit to output the third clock signal or the delayed signal of the third clock signal.

17. The data latch circuit of claim 16, wherein the hysteresis buffer is a Schmitt trigger.

18. The data latch circuit of claim 11, wherein the first clock signal and the third clock signal are generated from different clock generators.

* * * * *